US011391800B2

(12) United States Patent
Guenter et al.

(10) Patent No.: US 11,391,800 B2
(45) Date of Patent: Jul. 19, 2022

(54) SHIM DEVICE, MAGNET ASSEMBLY, AND METHOD FOR CHARGING A SHIM DEVICE

(71) Applicant: Bruker Switzerland AG, Faellanden (CH)

(72) Inventors: Kenneth J. Guenter, Zurich (CH); Robert Schauwecker, Zurich (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 17/218,355

(22) Filed: Mar. 31, 2021

(65) Prior Publication Data
US 2021/0302520 A1   Sep. 30, 2021

(30) Foreign Application Priority Data
Mar. 31, 2020 (DE) .......................... 102020204196.2

(51) Int. Cl.
  *G01R 33/3875* (2006.01)
  *G01R 33/3815* (2006.01)
  *H01F 6/06* (2006.01)
(52) U.S. Cl.
  CPC ..... *G01R 33/3875* (2013.01); *G01R 33/3815* (2013.01); *H01F 6/06* (2013.01)
(58) Field of Classification Search
  CPC .... G01R 33/3875; G01R 33/3815; H01F 6/06
  See application file for complete search history.

(56) References Cited

U.S. PATENT DOCUMENTS 8,965,468 B2   2/2015   Iwasa
9,599,687 B2   3/2017   Shvartsman et al.
(Continued)

FOREIGN PATENT DOCUMENTS

DE    102016225017 A1    6/2018
DE    102018221322 A1    6/2020
(Continued)

OTHER PUBLICATIONS

Park et al., "HTS Shim Coils Energized by a Flux Pump for the MIT 1/3-GHz LTS/HTS NMR Magnet: Design, Construction, and Results of a Proof-of-Concept Prototype", IEEE Transactions on Applied Superconductivity, vol. 28, Mo. 3, Apr. 2018, 6 pages.
(Continued)

*Primary Examiner* — G. M. A Hyder
(74) *Attorney, Agent, or Firm* — Edell, Shapiro & Finnan, LLC

(57) ABSTRACT

A shim device having an HTS shim conductor track (C) and a shim switch (Sw1) The track (C) is curved around an axis (z) and the shim switch is arranged in a first conductor track portion (S1), to interrupt its superconducting state. The track (C) extends around at least a first opening (O1) and a second opening (O2) such that the track (C) has a first circumferential current path (L1), a second circumferential current path (L2) and a third circumferential current path (L3). Two of the three paths (L1, L2, L3) each surround only one of the two openings and one of the three paths (L1, L2, L3) surrounds both openings. The first portion (S1) is part of only the first path (L1) and the second path (L2). This produces a persistent HTS shim for field homogenization, allowing both a complex field distribution and a large degree of design freedom.

15 Claims, 9 Drawing Sheets

(56) References Cited

U.S. PATENT DOCUMENTS

| | | |
|---|---|---|
| 9,766,312 B2 | 9/2017 | Grossniklaus et al. |
| 10,408,903 B2 | 9/2019 | Abe et al. |
| 2008/0129298 A1 | 6/2008 | Vaughan et al. |
| 2013/0102472 A1 | 4/2013 | Iwasa |
| 2018/0164388 A1 | 6/2018 | Guenter et al. |
| 2020/0185136 A1* | 6/2020 | Guenter ............ G01R 33/3875 |

FOREIGN PATENT DOCUMENTS

| | | | |
|---|---|---|---|
| JP | 02068038 | A | 3/1990 |
| JP | 11299132 | A | 10/1999 |
| JP | 2005109144 | A | 4/2005 |
| JP | 2015500127 | A | 1/2015 |
| JP | 2017142231 | A | 8/2017 |
| WO | 2016133204 | A1 | 10/2017 |

OTHER PUBLICATIONS

Iwasa et al., "Persistent-mode high-temperature superconductor shim coils: A design concept and experimental results of a prototype Z1 high-temperature superconductor shim", Applied Physics Letters, 103, Aug. 2013, 4 pages.

Honda et al., Experimental Verification of Screening-Current-Induced Field Reduction Using a New HTS Coil Structure, Cryogenics Engineering, vol. 52, No. 4, 2017, pp. 253-259.

Park et al., Prototype Rebco Z1 and Z2 shim coils for ultra high-field high-temperature superconducting NMR magnets. Scientific Reports, nature portfolio, Dec. 2020, 7 pp.

* cited by examiner

I

II

III

I

II/III

SHIM DEVICE, MAGNET ASSEMBLY, AND METHOD FOR CHARGING A SHIM DEVICE

CROSS REFERENCE TO RELATED APPLICATIONS

This application claims foreign priority under 35 U.S.C. § 119(a)-(d) to German Patent Application 10 2020 204 196.2 filed on Mar. 31, 2020, and the contents of which are incorporated into the present application by reference in their entirety.

FIELD OF THE INVENTION

The invention relates to a shim device for use in a magnet assembly, the shim device having at least one HTS (=high-temperature superconductor) material comprising a shim conductor track and a first shim switch, the shim conductor track lying on a surface that is curved around an axis and the first shim switch being arranged in a first conductor track portion of the shim conductor track in order to temporarily interrupt the superconducting state of the first conductor track portion. The invention also relates to a magnet assembly and to a method for charging a shim device.

BACKGROUND

A shim device and a method for charging the shim device are described, for example, in [1], [2] and in [3] (not published).

Shim coils are used to homogenize the main magnetic field of a magnet assembly. In particular, HTS coils can be used for this purpose, since shim coils made of HTS material can improve the field homogeneity of HTS main magnets, the operating fields or temperatures of which do not allow the use of LTS (=low-temperature superconductor) material for shim coils. In particular, superconductingly closed shim coils made of HTS-coated conductor tracks have the advantage that they can carry persistent currents, i.e., no power supply unit and no power supply lines are necessary to maintain the electric currents.

A charging method is known from [1] in which the shim coil is charged via a direct connection to a power supply unit. For this purpose, the superconducting shim circuit is interrupted by a superconducting switch being opened. The current is fed directly into the shim circuit by the power supply unit, which is connected in parallel with the superconducting switch. After closing the superconducting switch, the current flows persistently in the shim circuit and the current of the power supply unit is shut down. Due to their low inductance, persistent shim coils made of HTS-coated conductor tracks typically require significantly larger electric currents to generate a particular field strength than wound shim coils having a plurality of turns. The charging method known from [1] therefore has the disadvantage that the correspondingly large power supply lines conduct a lot of heat from outside into the cryostat. In addition, the high currents in the at least partly normally conducting supply lines generate additional Joule heat during the charging process. For a bath-cooled cryostat, this leads to faster evaporation of the cryogenic bath. For an actively cooled cryostat, a cryocooler having a correspondingly higher cooling capacity has to be used.

The as yet unpublished patent application [3] discloses an inductive charging method using a normally conducting charging coil that forms a primary circuit. The HTS shim device comprises an HTS shim conductor track and a shim switch, and forms a secondary circuit. In the secondary circuit, a change in the electric current (secondary current change) takes place inductively through a change in the magnetic flux generated by the charging coil.

Persistent HTS shims can be produced from HTS-coated films, the superconductingly closed shim conductor track extending around an opening in the film. The shim conductor tracks are rolled cylindrically around the bore in the magnet to be homogenized. An HTS shim for generating a specific field gradient can be produced using a plurality of rectangular closed conductor tracks [1] or using conductor tracks that follow a non-convex trajectory [2]. Although the variant described in [2] allows more complex field distributions to be generated using a single conductor track, the shim design options in the HTS circuit are limited. In the case of the known HTS shims, for example, it is not possible for reasons of symmetry to use a single conductor track to produce an on-axis shim for field gradients of even order ($z^2$, $z^4$, ...) without producing "impurities" of odd order, since with the known shim designs one-sided current feedback always has to take place. In order to keep the disturbances as small as possible, this is carried out axially outside, which, however, means that the shims have a relatively large axial extent.

SUMMARY

An object of the invention is to provide a persistent HTS shim for field homogenization, for example of an NMR magnet, which shim allows both a complex field distribution and a large degree of freedom in the design of the shim.

This object is addressed by a shim device, by a magnet assembly and by a method as described and as claimed hereinbelow.

In the shim assembly according to the invention, the shim conductor track extends around at least a first opening and a second opening such that the shim conductor track comprises a first circumferential current path, a second circumferential current path and a third circumferential current path, with two of the three circumferential current paths each surrounding only one of the openings and one of the three circumferential current paths surrounding the two openings. According to the invention, the first conductor track portion in which the first shim switch is located is part of only the first and the second circumferential current paths.

The shim conductor track is a self-contained conductor assembly made of high-temperature superconductor material, preferably an HTS coating on a film. This can be, for example, a joint-free conductor track assembly. The shim conductor track is superconductingly short-circuited during operation, i.e., the circumferential current paths of the shim conductor track have no electrical resistance (when the first shim switch is closed). This is achieved, for example, by circumferential shim conductor tracks made of HTS being applied directly to a carrier film or being constructed from an HTS-coated film.

The shim conductor track lies on a surface which is cylindrically curved or "coiled" around the longitudinal axis of the shim device (axis z). The shim conductor track thus typically extends on one or more cylinder lateral surfaces. When the shim device is used in a magnetic resonance apparatus, the longitudinal axis around which the surface having the shim conductor track is curved is also the longitudinal axis of the main magnet of the magnetic resonance apparatus.

The shim device according to the invention can have one or more shim conductor tracks.

Regions that are surrounded by parts of the shim conductor track are referred to as openings. The shim conductor track thus forms continuous loops around two non-superconducting regions (openings), with each circumferential current path forming a geometrically closed loop. The openings can be designed, for example, as cut-outs from the coated film or as regions that are etched away or removed from the HTS layer.

More than three circumferential current paths and correspondingly more than two openings can also be provided within a shim conductor track. This allows more complex shim conductor tracks to be produced.

The circumferential current paths are in the form of conductor track loops that are superconductingly closed or closable during operation (i.e., after charging). The circumferential current paths are thus both geometrically (circumferentially) and electrically closed.

According to the invention, a conductor track topology is therefore proposed which has two openings having circumferential current paths and thus branches, the first and the second circumferential current path having a shared conductor track portion which can be resistively interrupted. The shim conductor track made of HTS material therefore encloses at least two openings, resulting in at least three circumferential current paths: a circumferential current path around the first opening, a circumferential current path around the second opening and a circumferential current path around the two openings. The third circumferential current path does not comprise the conductor track portion shared by the two other circumferential current paths.

The conductor track topology according to the invention makes it possible to design shims having current trajectories from a single closed shim conductor track, which shims cannot be produced using a single, simply connected, closed shim conductor track. The provision according to the invention of three circumferential current paths within a single shim conductor track therefore provides additional degrees of freedom in the design of current trajectories within the shim conductor track. A large number of different field gradients or combinations of field gradients can therefore be generated, in particular field gradients exclusively of even order, meaning that unwanted influences due to asymmetrical current feedback do not alter the field gradient.

Only the first and the second circumferential current path share the first conductor track portion which contains the first shim switch, and therefore the third circumferential current path cannot be resistively interrupted by the first shim switch. The first shim switch can thus resistively interrupt the first and the second circumferential current paths at the same time, while the third circumferential current path remains in the superconducting state. The third circumferential current path is therefore preferably permanently superconductingly closed during operation. This is particularly advantageous if the first and the second circumferential current paths have the same inductance and consequently each path extends around only one opening, while the third circumferential current path extends around the two openings. A simple charging method can then be used to induce electric currents in particular of equal strength with opposite directions of circulation in the first and the second circumferential current paths. This allows geometrically simple HTS shims for generating field distributions having a certain symmetry to be produced.

However, embodiments are also feasible in which the third circumferential current path extends around only one opening and either the first or the second circumferential current path extends around the two openings. This embodiment can be particularly advantageous for more general forms of HTS shims of which the first and the second circumferential current path do not have the same inductance.

The shim conductor track is preferably coiled in at least one layer around the axis (z-axis) and has at least two conductor track portions which extend in parallel with the axis and lie radially one above the other. Only when a shim conductor track is coiled in at least one complete layer around the axis (z) can it generate a field distribution that is (with respect to the axis z) almost axially symmetrical (on-axis shims). Conductor track portions extending in parallel with the axis (z) do not generate any axial magnetic field components and consequently do not contribute to the desired field distribution generated by the shim conductor track. By spatially superimposing such conductor track portions with opposite electric currents, their contribution to the field distribution can be virtually completely suppressed.

Coiling the shim conductor track in a plurality of layers opens up further options for shim design:

In specific embodiments, for example, a plurality of azimuthally circumferential conductor track portions are arranged at different axial positions (with respect to axis z). In this way, on-axis shims for generating field gradients of even order can be produced in particular.

In other embodiments, conductor track portions of shim conductor tracks coiled in n layers extend in the same manner in all layers. In such shim conductor tracks, during inductive charging, electric currents are obtained which are n times smaller than in a shim conductor track which is coiled in a single layer and has the same geometry. The generated magnetic field distribution, in particular the field strength, is the same in both cases. A shim conductor track coiled in a plurality of layers in this way therefore has the advantage that it can be designed so as to have a lower superconducting current-carrying capacity.

In a preferred embodiment of the shim device according to the invention, the shim conductor track extends symmetrically with respect to a reflection on a normal plane of the axis. When using the shim device according to the invention in a magnetic resonance apparatus, the normal plane is typically located in the center of the main magnet (z=0). Such HTS shims generate magnetic field gradients that are symmetrical (even order) or antisymmetrical (odd order) with respect to the normal plane.

In a first embodiment of this type of shim device according to the invention, the first circumferential current path and the second circumferential current path each extend antisymmetrically with respect to a reflection on the normal plane of the axis. An antisymmetrical current path is to be understood as a symmetrical path with reverse current direction. This allows a field distribution that is asymmetrical with respect to a transverse axis to be generated perpendicularly to the longitudinal axis, provided that the shim conductor track is coiled in a single layer and current flows through the first and the second circumferential current path in opposite directions. Shim devices having such a field distribution can be used as an off-axis shim (e.g., rz shim).

In an alternative, second embodiment of this type of shim device according to the invention, the first circumferential current path and the second circumferential current path do not each extend antisymmetrically with respect to the reflection on the normal plane of the axis. What is meant here is the symmetry of the two circumferential current paths with respect to the same normal plane. This allows a field distribution to be generated that is symmetrical with respect to the longitudinal axis (field distribution is symmetrical with respect to a normal plane of the axis z at z=0); i.e., there are no field gradients of odd order (e.g., pure $z^2$ or $z^4$ shim), provided that the first and the second circumferential current path have the same geometry and current flows through said paths in opposite directions. Shim devices having such a field distribution can be used as an on-axis shim of even order.

The first circumferential current path preferably has the same inductance as the second circumferential current path. In particular, this can be achieved by providing the same shape and the same dimensions for the circumferential current paths. This allows a particularly simple charging method, meaning that the electric currents in the two circumferential current paths are the same after charging. This is particularly advantageous in shim devices in which the shim conductor track extends symmetrically with respect to the reflection on the normal plane of the axis, since the symmetry of the shim conductor track is reflected in the current distribution and thus also in the field distribution.

The shim conductor track is preferably made of an HTS-coated film, which is preferably electrically bridged with high resistance. REBCO (rare earth barium copper oxide), for example YBCO (yttrium barium copper oxide) or GdBCO (gadolinium barium copper oxide), or BSCCO (bismuth strontium calcium copper oxide) can be used as the HTS material, for example. The HTS layer of the shim conductor track is typically protected by an overlying silver layer that is only a few µm thick (bridged with high resistance). If the main magnet is quenched, the shim conductor track is normally also quenched via the inductive coupling. Sufficiently high electrical resistance of the bridging silver layer prevents induced currents from causing damage to the shim conductor track (quench protection). In addition, the currents induced in the shim conductor track during charging or when the main magnet is quenched can be reduced by the shim conductor track being designed such that the inductive couplings between the circumferential current paths and the main magnet are as small as possible.

In a third embodiment of the shim device according to the invention, a further shim switch is arranged in a further conductor track portion in order to temporarily interrupt the superconducting state, the further conductor track portion being part of the third circumferential current path. In the case of two openings, either the first or the second circumferential current path can thus be interrupted by the two shim switches, while the other two circumferential current paths can be interrupted by only one of the shim switches. This allows a current that is inadvertently induced in the shim conductor track when the main magnet is being charged to be quenched by opening the further shim switch. The principle of a flux pump can also be used to charge the shim conductor track. In addition, this embodiment can be used to produce a shim conductor track that generates two different gradients, the field strengths of which can be set independently of one another when charging the shim conductor track (e.g., z-$z^2$ hybrid shim, with a z gradient being generated by the third circumferential current path and a $z^2$ gradient being generated jointly by the first and the second circumferential current path).

The further shim switch is preferably used to interrupt the current path extending around the two openings, while the first shim switch is arranged such that it can interrupt only the current paths each extending around a single opening.

The invention also relates to a magnet assembly for a magnetic resonance apparatus, the magnet assembly comprising:

a cryostat having a room temperature bore,
    a superconducting magnet coil system that is arranged in the cryostat and has
    a main magnet for generating a magnetic field in the direction of an axis in a working volume through which the axis extends and
    a shim device according to any of the preceding claims for setting the spatial profile and/or for spatially homogenizing a magnetic field generated by the main magnet in the working volume,
    and a charging device having at least one charging coil which is configured to inductively couple to the at least one shim conductor track of the shim device.

The magnet assembly according to the invention is preferably configured such that the shim device can be charged according to the method described below.

The working volume of the magnet assembly is arranged around a point lying on the longitudinal axis of the main magnet. At least part of the shim conductor track of the shim device is arranged, with respect to the longitudinal axis of the main magnet, radially inside the main magnet. The longitudinal axis of the main magnet is preferably identical to the axis of the shim device (z-axis) around which the shim conductor track is arranged.

During operation, the shim conductor track generates a magnetic field having an axial component with respect to a cylindrical coordinate system around the z-axis.

The charging device preferably comprises a normally conducting charging coil, a power supply and supply lines, which together form at least one primary circuit, the charging coil being arranged or temporarily arrangeable in the room temperature bore of the cryostat. The shim conductor track, as a secondary circuit, can be inductively charged via the primary circuit.

During the charging process, the charging coil preferably couples inductively, to varying degrees, to the first circumferential current path and to the second circumferential current path. This can be achieved, for example, by the charging coil being axially and/or radially at a different distance from the first circumferential current path than from the second circumferential current path. This is important for a shim conductor track of which the first circumferential current path has the same inductance as the second circumferential current path. In this case, it can be ensured that when the first shim switch is closed, the first and the second circumferential current path are influenced differently by the charging coil. In this way, after the current in the charging coil has been reduced (third phase), a current remains within the shim conductor track.

The charging coil is preferably arranged close to an axial end of the shim device during the charging process.

In a specific embodiment of the magnet assembly according to the invention, different circumferential current paths inductively couple to the same charging coil. This can be achieved by a suitable design or positioning of the charging coil relative to the circumferential current paths and has, for example, the advantage that different shim conductor tracks can be charged via a single charging coil. Alternatively, different shim conductor tracks can be charged via different charging coils having appropriately optimized inductive couplings.

The invention also relates to a method for charging an above-described shim device in an above-described magnet assembly, with a change in the electric current in the shim conductor track taking place inductively via a change in a magnetic flux, generated by the charging coil, through the surface enclosed by the shim conductor track, wherein I. in a first phase, in any sequence, the first shim switch is opened at least temporarily in order to interrupt the superconducting state, and an electric current change is induced in at least one of the circumferential current paths by changing a current in the charging coil or by moving the charging coil, II. in a second phase, two of the circumferential current paths are superconductingly closed by closing the first shim switch; and III. in a third phase, when the first shim switch is closed, electric current changes are induced in the circumferential current paths by changing a current in the charging coil or by moving the charging coil.

Charging by induction makes it possible to dispense with power supply lines to the shim conductor track. The charging coil is preferably arranged such that the circumferential current paths that extend around only one opening do not couple inductively to the charging coil in equal measure. This is of particular interest for those assemblies in which the first and the second circumferential current paths have the same shape and the same dimensions (and consequently the same inductance).

In the first phase, the electric current in the charging coil is changed. If no stationary charging coil is provided in the room temperature bore, the charging coil is also positioned in the room temperature bore of the cryostat (before or after the current change in the charging coil). After the first phase, the first and the second circumferential current paths are resistively interrupted and an effective induced current flows in the third closed circumferential current path (assuming that the third circumferential current path was completely discharged before the first phase).

In the second phase, the first shim switch is closed. After the second phase, the first and the second circumferential current paths are thus superconductingly closed. Due to the conservation of flux, the electric currents in the shim conductor track do not change.

In the third phase, when the first shim switch is closed, the electric current in the charging coil is altered and/or the charging coil is removed from the room temperature bore. The resulting flux change generally influences the first and the second circumferential current paths differently such that, after the charging process, currents having different current intensities and/or directions of circulation flow in said paths.

The current change in the charging coil in the third phase is preferably the same as the current change in the charging coil in the first phase, but with the opposite sign. If the charging coil does not carry any current at the beginning of the charging process, its current is therefore also zero at the end of the charging process. This has the advantage that the charging coil can be positioned at the shim conductor track or removed again therefrom before and after the charging process, without this leading to additional flux changes in the shim conductor track.

In a specific variant of the method according to the invention, the third circumferential current path remains superconductingly closed during the charging process.

A specific variant of the method according to the invention relates to a method for charging a shim device having a further shim switch in order to temporarily interrupt the superconducting state in a further conductor track portion of the shim conductor track different from the first conductor track portion.

In addition to the three phases described above, three further method steps are carried out in the first phase: 1. the further shim switch is opened at least once in order to interrupt the superconducting state of the further conductor track portion; 2. further electric current changes are induced in the circumferential current paths by changing a current in the charging coil or by moving the charging coil; and 3. the further shim switch is closed. These three steps are carried out in the current change in the charging coil or movement of the charging coil contained in the first phase already described above.

By opening the shim switch in the first phase, the current previously present in the circumferential current paths is set to zero. In this phase, the first and the further shim switches can in principle be opened and closed as often as desired. It is merely important that the further shim switch remains closed during and after the second described current change in the first phase and the first shim switch is closed during and after the current change in the third phase.

Further advantages of the invention can be found in the description and the drawings. According to the invention, the features mentioned above and set out in the following can also each be used individually per se or together in any combination. The embodiments shown and described are not to be understood as an exhaustive list but instead are of an exemplary nature for describing the invention.

DETAILED DESCRIPTION

Figure 1:
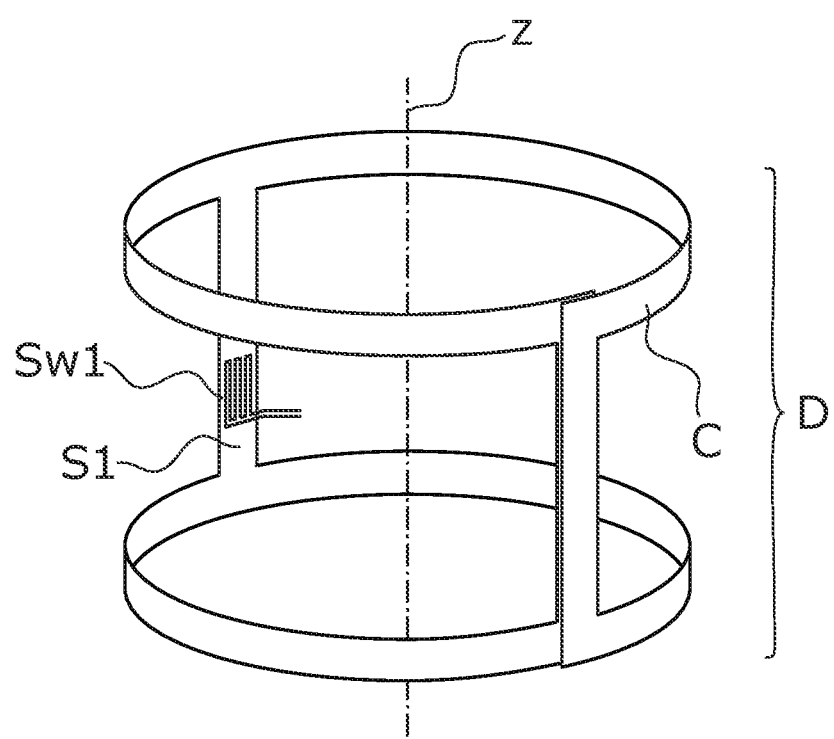
FIG. 1 is a perspective view of a first embodiment of a shim device according to the invention, in which the first circumferential current path and the second circumferential current path extend antisymmetrically with respect to the reflection on the normal plane of the axis (z).

Various embodiments of the shim device D, D', D" according to the invention are shown in FIG. 1-5. The shim device D, D', D" according to the invention comprises a shim conductor track C which is made of HTS material and extends on a cylinder surface around an axis z, as shown in FIG. 1 and in FIG. 3. The shim conductor track C completely surrounds the axis z, that is to say it is "wound" around the axis z at least once. The shim conductor track C has a first circumferential current path L1 around a first opening O1 and a second circumferential current path L2 around a second opening O2. A third circumferential current path L3 extends around the two openings O1, O2. The circumferential current paths L1, L2, L3 are formed of conductor track portions of the shim conductor track C (shown hatched). For the sake of clarity, the courses of the circumferential current paths L1, L2, L3 are drawn in dashed lines offset laterally from the corresponding conductor track portions. A first shim switch Sw1, which can interrupt the superconducting state of a first conductor track portion S1, is arranged in the first conductor track portion S1. The first circumferential current path L1 and the second circumferential current path L2 share a first conductor track portion S1.

Figure 2:
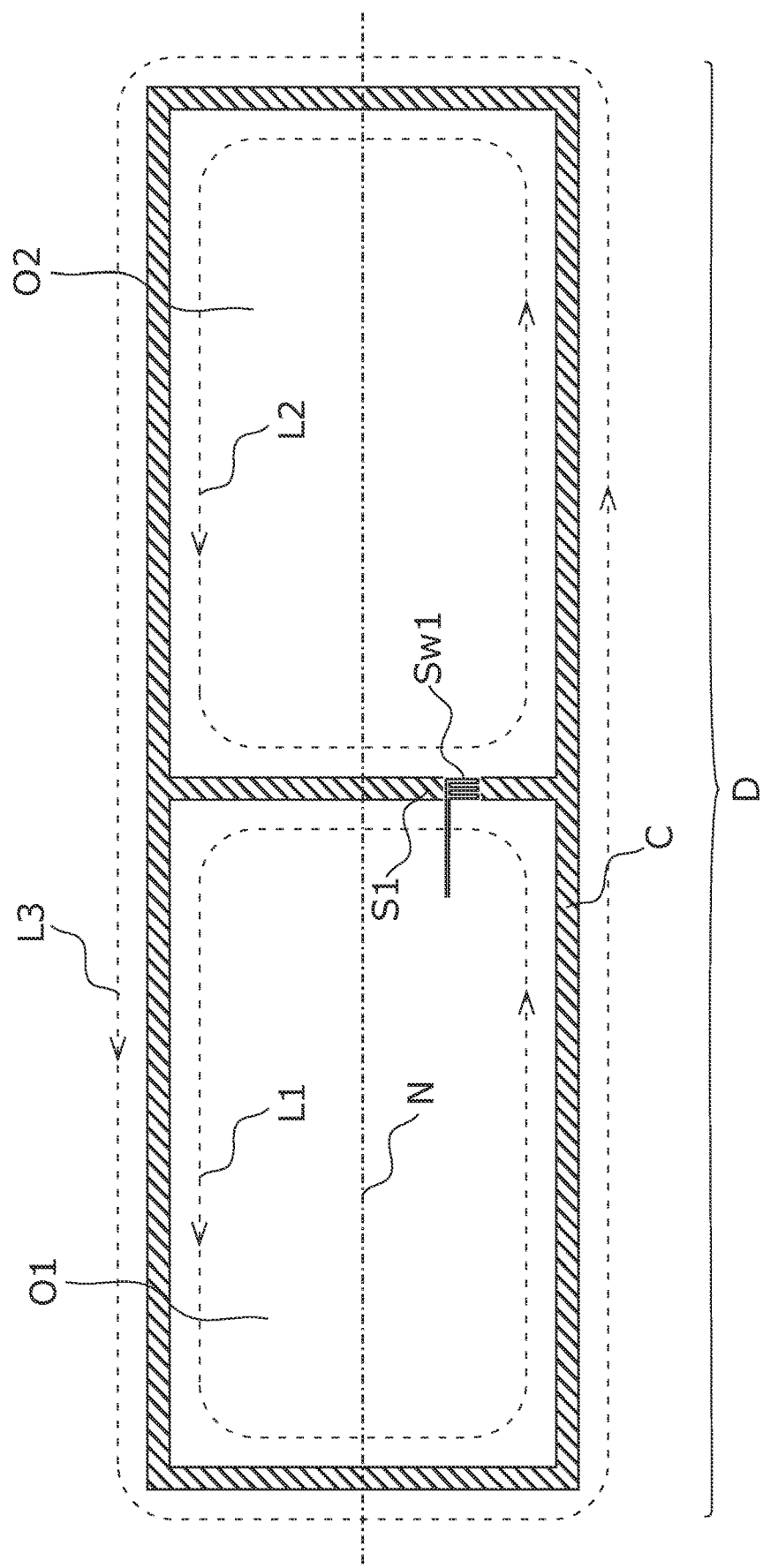
FIG. 2 is a flat pattern view of the shim device from FIG. 1.

FIG. 1 is a perspective view and FIG. 2 is a flat pattern view of a first embodiment of a shim device D according to the invention. In the embodiment shown in FIGS. 1 and 2, both the shim conductor track C as a whole and the individual circumferential current paths L1, L2, L3 have a symmetry or antisymmetry with respect to a reflection on a normal plane N of the axis z. For this purpose, the shim conductor track C extends once completely around the axis z, the conductor track end portions that extend in parallel with the axis z overlapping in the radial direction, as shown in FIG. 1. In the embodiment shown in FIGS. 1 and 2, the first shim switch Sw1 is located in the first conductor track portion S2, which is part of the first circumferential current path L1 and of the second circumferential current path L2, the first and the second circumferential current paths each extending around only one of the two openings O1, O2. The first shim switch Sw1 could also be arranged in a different conductor track portion such that either the first or the second circumferential current path extends around the two openings O1, O2.

In the specific topology shown in FIGS. 1 and 2, all azimuthally extending conductor track portions contribute to the desired on-axis field. There are no unwanted disturbances due to current feedback. The entire shim conductor track C can therefore have a small axial extent, so that particularly compact shim conductor tracks C can be produced from relatively narrow HTS films.

Figure 3:
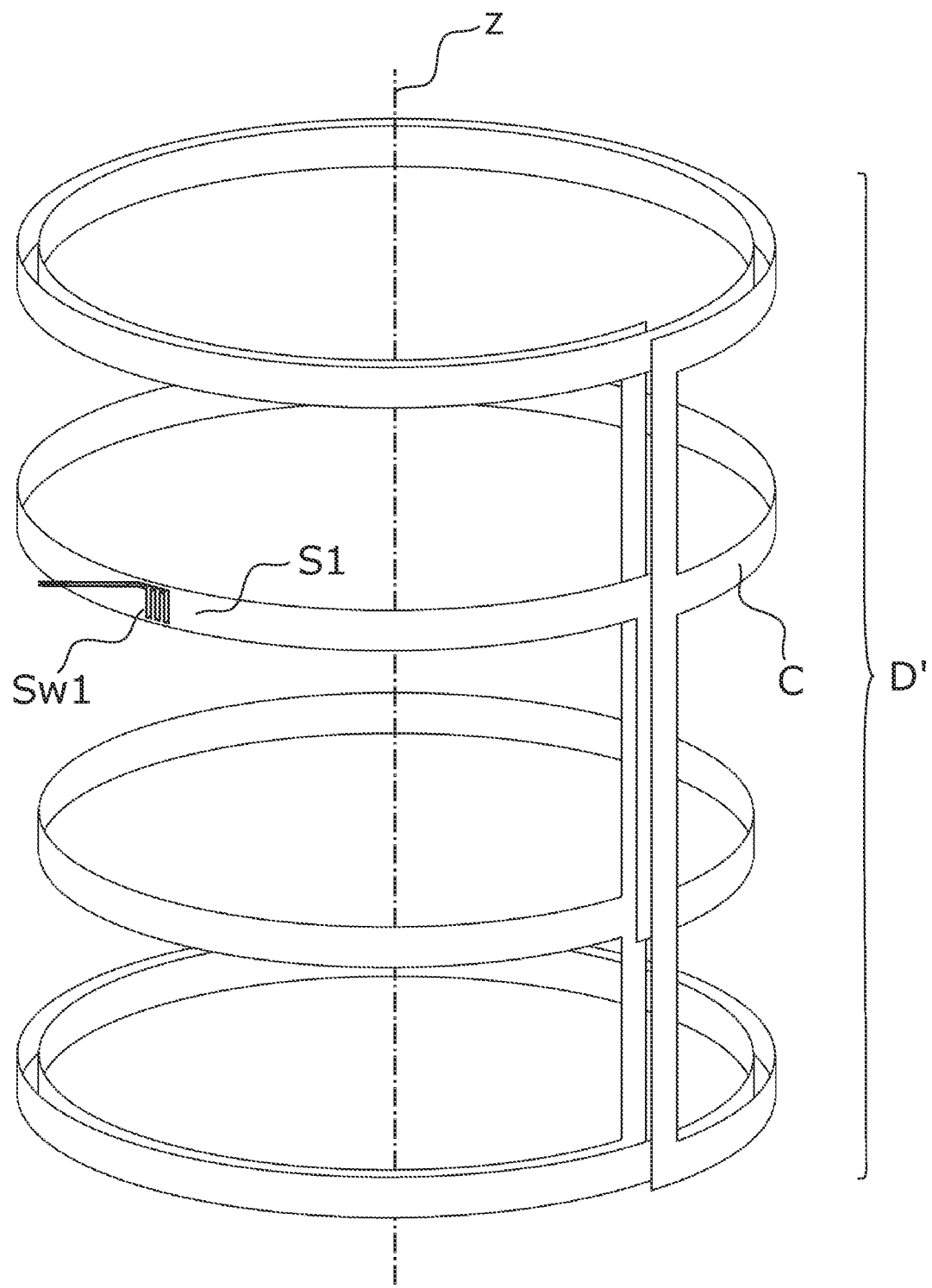
FIG. 3 is a perspective view of a second embodiment of a shim device according to the invention, in which the first circumferential current path and the second circumferential current path do not extend antisymmetrically with respect to the reflection on the normal plane of the axis (z).
Figure 4:
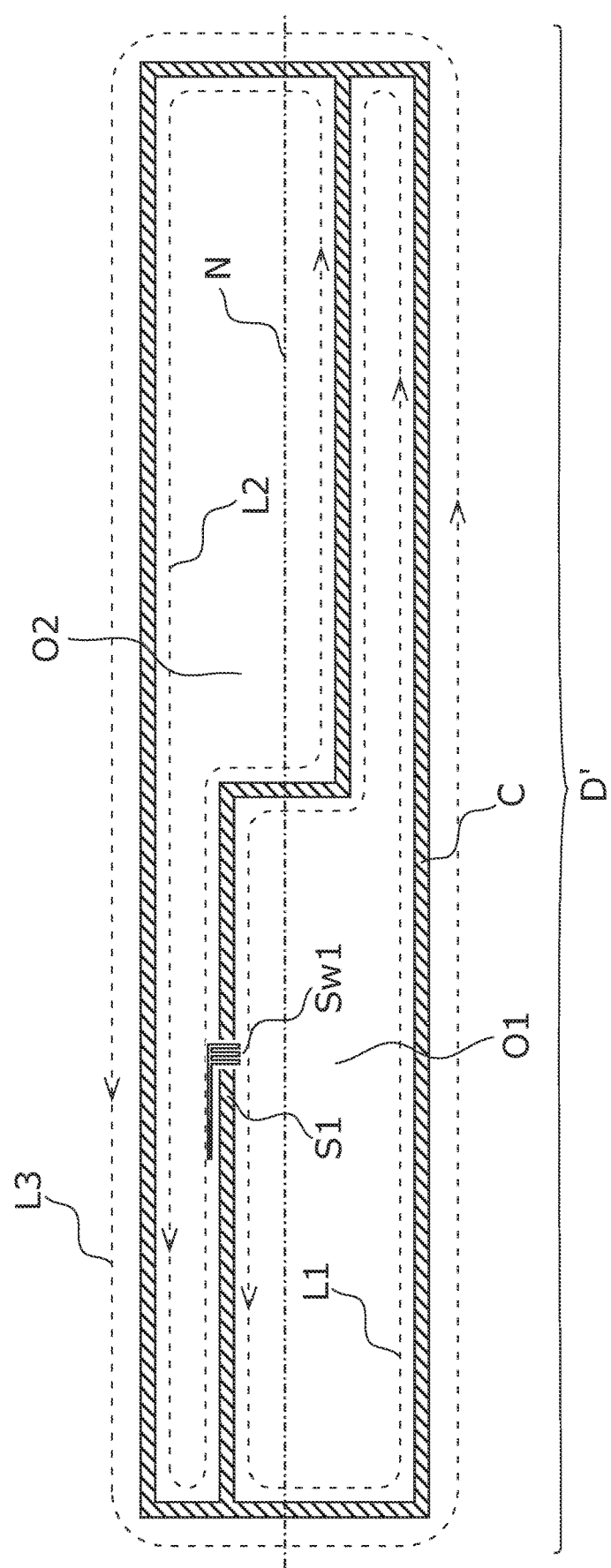
FIG. 4 is a flat pattern view of the shim device from FIG. 3.

FIG. 3 is a perspective view and FIG. 4 is the associated flat pattern view of a second embodiment of the shim device D' according to the invention, in which, although the shim conductor track C is symmetrical with respect to a normal plane N of the axis z, the first circumferential current path L1 and the second circumferential current path L2 do not have any antisymmetry with respect to a reflection on the normal plane N of the axis z. The symmetry of the shim conductor track C is achieved by the shim conductor track extending twice completely around the axis z, the conductor track end portions that extend in parallel with the axis z and a conductor track middle portion that extends in parallel with the axis z overlapping in the radial direction, as shown in FIG. 3. In the embodiment shown in FIGS. 3 and 4, the first shim switch Sw1 is located in the first conductor track portion S1, which is part of the first circumferential current path L1 and the second circumferential current path L2, the first and the second circumferential current path each extending around only one of the two openings O1, O2. The first shim switch Sw1 could also be arranged in a different conductor track portion such that either the first or the second circumferential current path extends around the two openings O1, O2.

Figure 5:
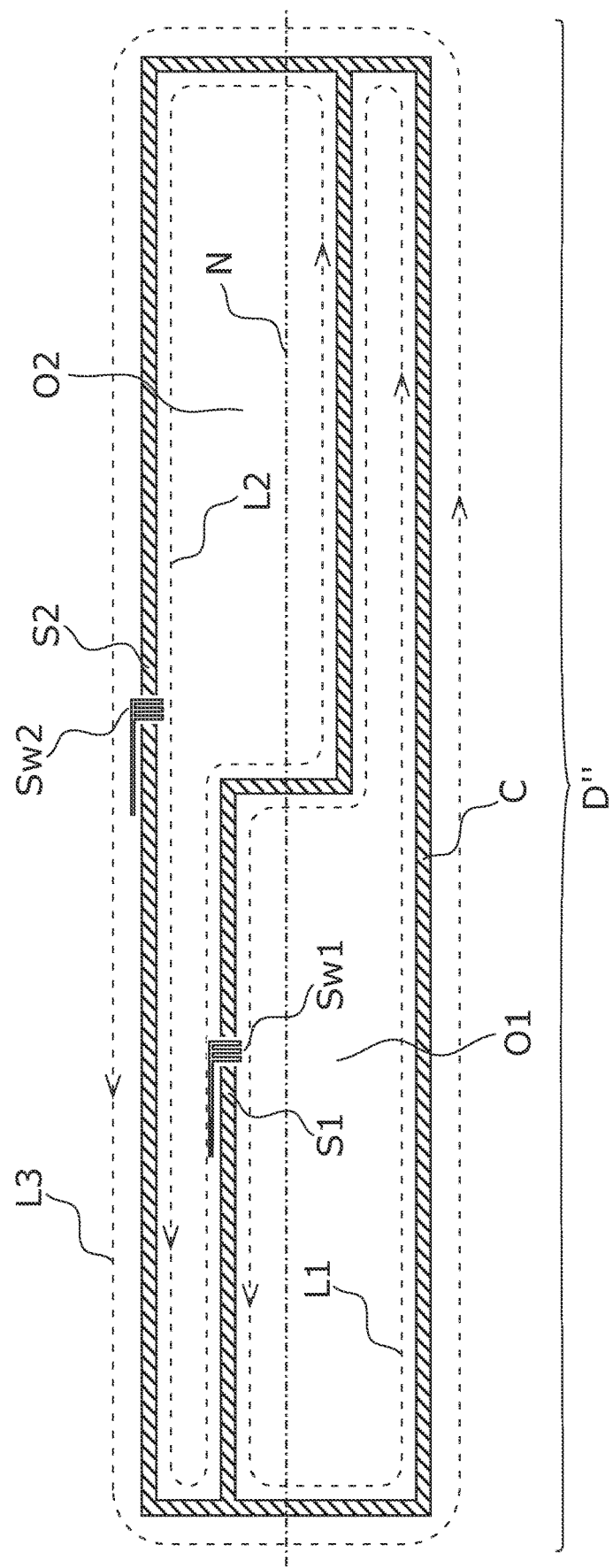
FIG. 5 is a flat pattern view of a third embodiment of a shim device according to the invention having a further superconducting shim switch.

FIG. 5 shows a flat pattern view of a further embodiment of the shim device D" according to the invention, in which, although the shim conductor track C is symmetrical with respect to the normal plane N of the axis z, the first circumferential current path L1 and the second circumferential current path L2 do not have any antisymmetry with respect to a reflection on a normal plane N of the axis z (analogously to the embodiment shown in FIGS. 3 and 4). In addition to the first shim switch Sw1 arranged in the first conductor track portion S1, the shim device from FIG. 5 comprises a further shim switch Sw2 in a further conductor track portion S2. The two conductor track portions S1, S2 are arranged in the second circumferential current path L2. They differ in that the first shim switch Sw1 is arranged in the first circumferential current path L1 and the further shim switch Sw2 is arranged in the third circumferential current path L3.

Using the embodiments shown in FIGS. 3-5, field distributions can be generated which are purely symmetrical with respect to the normal plane N (in the magnet center), i.e., contain no field gradients of odd order in the axial direction.

Figure 6:
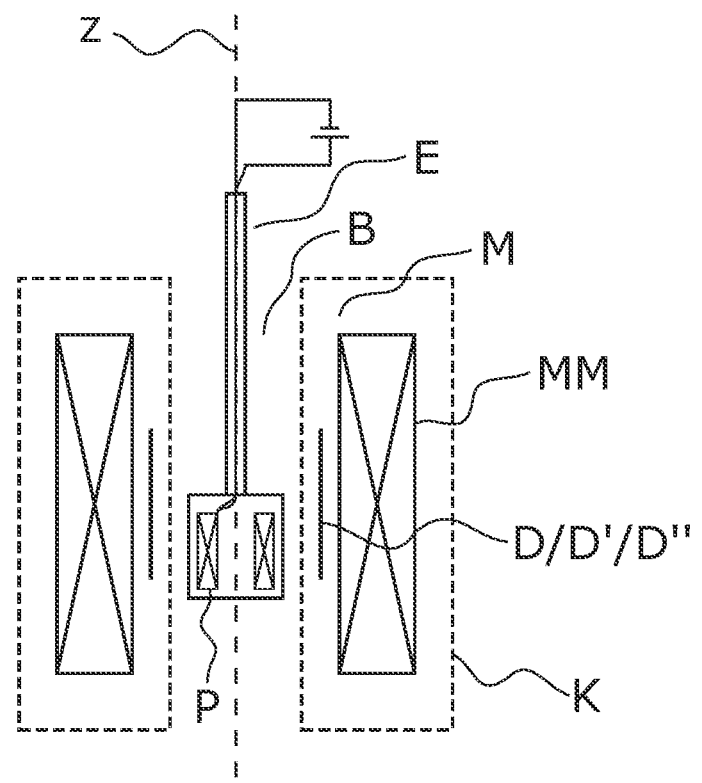
FIG. 6 shows a magnet assembly according to the invention.

FIG. 6 shows a magnet assembly according to the invention. Said assembly comprises a cryostat K having a room temperature bore B. In the cryostat K, there is a magnet coil system M having a main magnet MM which is intended for generating a main magnetic field and has a main-magnet longitudinal axis identical to the axis of the shim device (z-axis) around which the shim conductor track is arranged. The magnet coil system also has a shim device D, D', D" according to the invention for adjusting or homogenizing the main magnetic field. A charging device E is provided for charging the shim device D, D', D", in particular for charging the shim device D, D', D" inductively. The charging device E comprises a charging coil P, which can be energized by a power supply via supply lines. The charging coil P is arranged within the room temperature bore B for the charging process, so that the charging coil P can optimally couple to the shim conductor track C. The process for charging the shim device D, D', D" is carried out inductively.

Figure 7:
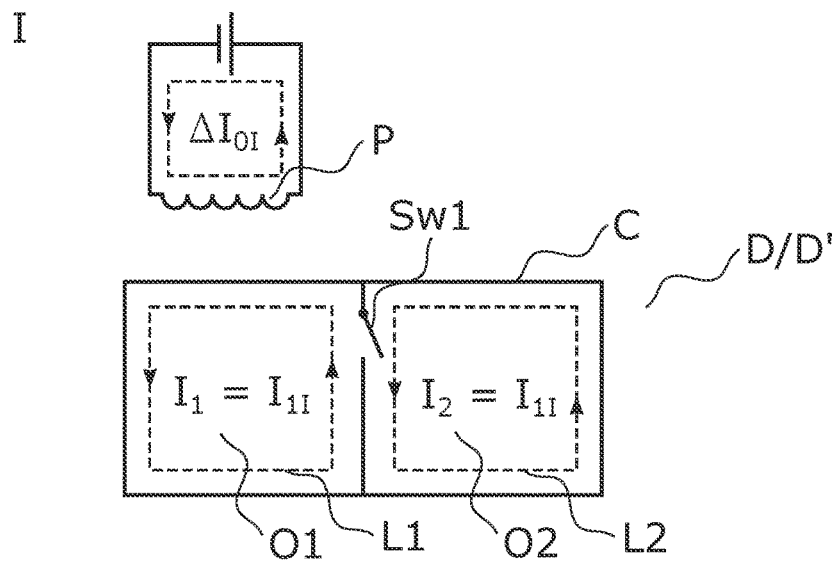
FIG. 7 shows the different method phases of a first variant of the method according to the invention using a shim device having a first superconducting shim switch in the first and the second circumferential current path, which paths each extend around only one opening.
Figure 7:
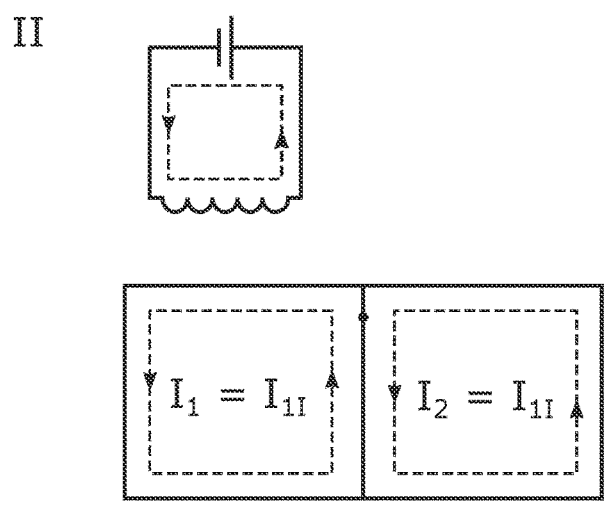
Figure 7:
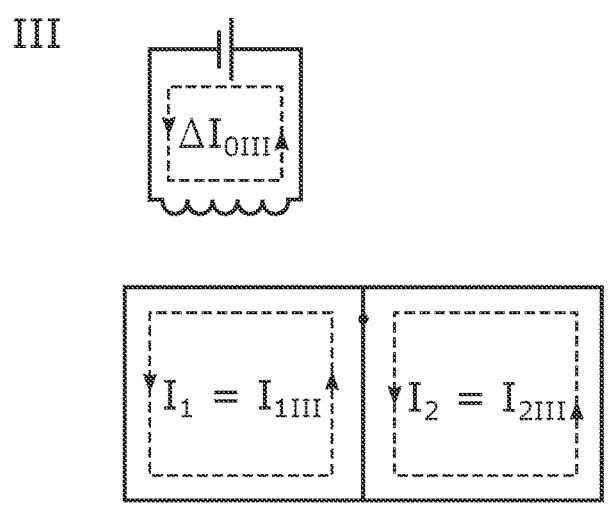
Figure 8:
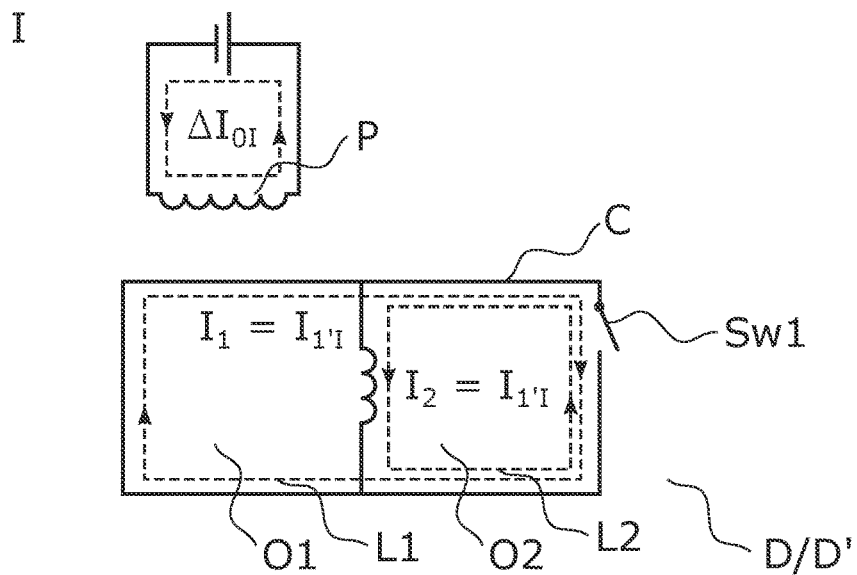
FIG. 8 shows the different method phases of a first variant of the method according to the invention using a shim device having a first superconducting shim switch in the first and the second circumferential current path, the first circumferential current path extending around the two openings.
Figure 8:
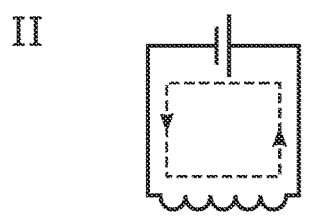
Figure 8:
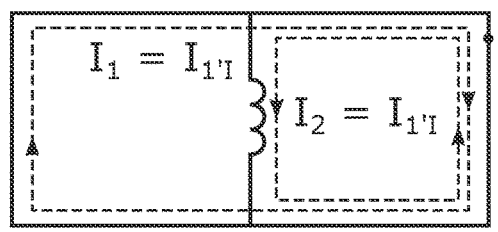
Figure 8:
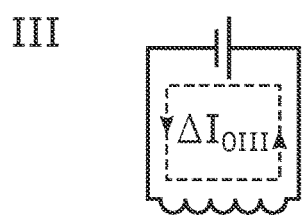
Figure 8:
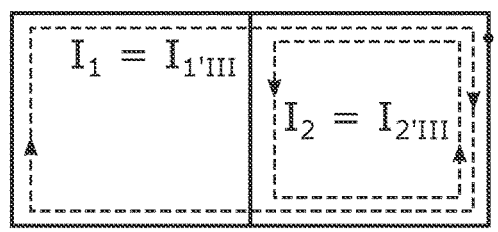
Figure 9:
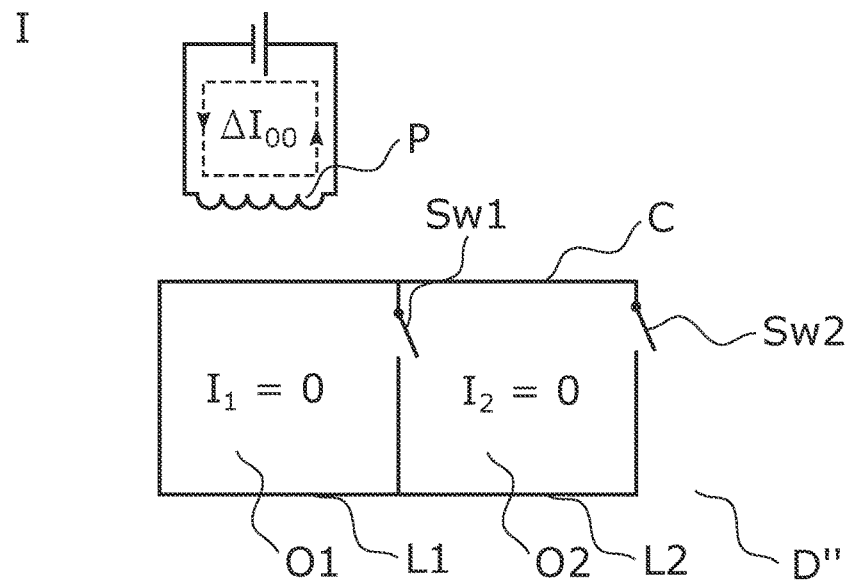
FIG. 9 shows the different method phases of a first variant of the method according to the invention using a shim device having two superconducting shim switches.
Figure 9:
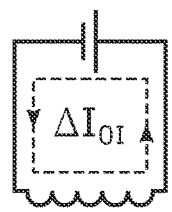
Figure 9:
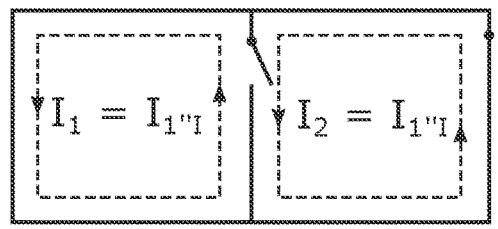
Figure 9:
Figure 9:
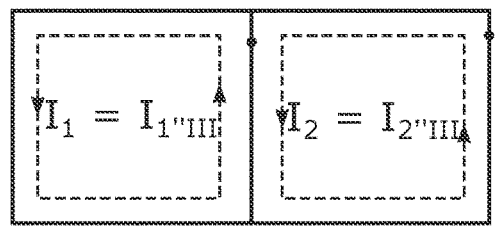

The different phases for different method variants are shown schematically in FIGS. 7-9. The electric currents in the charging device E, and for the first and the second circumferential current paths L1, L2, are shown for the different phases I, II, III. The direction of the arrow defines the direction of positive current in each case. For conductor track portions that are part of both the first circumferential current path L1 and the second circumferential current path L2, the electric currents of the respective circumferential current paths are shown. The current actually flowing in the corresponding conductor track portion is obtained by superimposing the currents shown in the figures for the shared conductor track portions.

Since, for a shim conductor track C having a single (first) shim switch Sw1, the third circumferential current path is not interrupted during the charging process (phases I-III), the magnetic flux through its surface remains unaltered at zero. As a result, the electric currents in the first and the second circumferential current path, after charging, flow in the same direction via the closed shim switch Sw1 before they divide via a branch.

FIG. 7 schematically shows the different method phases I, II, III of a first variant of the method according to the invention using a shim device D/D' having a first shim switch Sw1 in the shared first conductor track portion of the first and the second circumferential current path L1, L2. The first circumferential current path L1 extends around only the first opening O1 and the second circumferential current path extends around only the second opening O2.

In the first phase I, the first shim switch Sw1 is open at least temporarily in order to interrupt the superconducting state. In the charging coil P, an electric current change $\Delta I_{0I}$ is caused or the energized charging coil P is moved relative to the shim device D/D'. This induces an electric current change in the shim conductor track C.

If the first switch Sw1 is open during the current change, the effective current in the first conductor track portion S1, which is part of both the first circumferential current path L1 and the second circumferential current path L2, is zero due to the opened first shim switch Sw1. This results in the same value $I_{1I}$ for the electric current in the first circumferential current path $I_1$ as for the electric current in the second circumferential current path $I_2$.

If the first shim switch Sw1 is closed during the current change and is opened after the current change, the same value $I_{1I}$ is likewise obtained for the current in the first circumferential current path $I_1$ as for the current in the second circumferential current path $I_2$.

After the first phase I, the first and the second circumferential current paths L1, L2 are resistively interrupted.

In the second phase II, the first shim switch Sw1 and thus the first and the second circumferential current paths L1, L2 are superconductingly closed. Due to the conservation of flux, no change in the current flow is caused within the shim conductor track C.

In the third phase III, when the first shim switch Sw1 is closed, an electric current change is induced in the circumferential current paths L1, L2, L3 through an electric current change $\Delta I_{0III}$ in the charging coil P or by moving the charging coil P (not shown). Since the charging coil P influences the first circumferential current path L1 in a different manner than for the second circumferential current path L2 (depending on where the charging coil P is arranged and what inductances and inductive coupling the first and the second circumferential current paths L1, L2 have), a current change from $I_{1I}$ to $I_{1III}$ is caused in the first circumferential current path L1, whereas a current change from $I_{1I}$ to $I_{2III}$ is caused in the second circumferential current path L2. This produces a resulting current in the shared first conductor track portion S1.

In FIG. 8, phases I, II, III are schematically shown analogously to FIG. 7 for a variant in which the first circumferential current path L1 extends around both the first opening O1 and around the second opening O2, since the first conductor track portion S1 having the first shim switch Sw1 is now arranged in a different manner than in FIG. 7.

In the first phase I, the first shim switch Sw1 is open at least temporarily in order to interrupt the superconducting state. In the charging coil P, an electric current change $\Delta I_{0I}$ is caused or the energized charging coil P is moved relative to the shim device D/D'. This induces an electric current change in the shim conductor track C.

If the first shim switch Sw1 is open during the current change, the effective current in the first conductor track portion, which is part of both the first circumferential current path L1 and the second circumferential current path L2, is zero due to the opened first shim switch Sw1. Currents $I_1=I_{1I}$ and $I_2=I_{1I}$ of equal strength are thus induced in the first circumferential current path L1 and in the second circumferential current path L2.

If the first shim switch Sw1 is closed during the current change and is opened after the current change, $I_1=I_2=I_{1I}$ is also obtained for the electric currents in the first and the second circumferential current path.

After the first phase I, the first and the second circumferential current path L1, L2 are resistively interrupted.

In the second phase II, the first shim switch Sw1 and thus the first and the second circumferential current path L1, L2 are superconductingly closed. Due to the conservation of flux, no change in the current flow is caused within the shim conductor track C.

In the third phase III, when the first shim switch Sw1 is closed, an electric current change is induced in the circumferential current paths L1, L2, L3 through a current change $\Delta I_{0III}$ in the charging coil P or by moving the charging coil P (not shown). Since the charging coil P influences the first circumferential current path L1 in a different manner than for the second circumferential current path L2 (depending on where the charging coil P is arranged and what inductances and inductive coupling the first and the second circumferential current path L1, L2 have), a current change from $I_{1I}$ to $I_{1III}$ is caused in the first circumferential current path L1, whereas a current change from $I_{1I}$ to $I_{2III}$ is caused in the second circumferential current path L2.

In FIG. 9, an example of a method variant for a shim device D" having two shim switches Sw1, Sw2 is shown schematically. In addition to the method steps in phases I-III described above, further steps are carried out in the first phase I. A current change $\Delta I_{00}$ is thus caused in the charging coil P. Before or after this energization of the charging coil P, the shim switches Sw1, Sw2 are opened. This has the effect that, irrespective of the energization of the charging coil P, the circumferential current paths L1, L2, L3 are subsequently current-free. This makes it possible, for example, to select the current intensity of the charging coil P in the first phase I such that, at the end of the charging process, the current in the charging coil P is zero, meaning that the charging coil P can be removed from the shim device D" without inducing unwanted currents.

Later in the first phase I, the further shim switch Sw2 is initially closed, whereupon the current in the charging coil P is set to a predefined value $I_{0I}$. This induces a current $I_{1I}$ in the first and in the second circumferential current path L1 and L2 (or equivalently in the third circumferential current path L3). In the example shown in FIG. 9, the first and the second circumferential current path L1, L2 each extend around only one of the two openings O1, O2. The rest of the method is therefore carried out analogously to phases II and III in FIG. 7.

The method variant described with the aid of FIG. 9 is also possible if the positions of the two shim switches Sw1, Sw2 are interchanged. The rest of the method then takes place analogously to FIG. 8.

In all variants of the method according to the invention having a single (first) shim switch Sw1, after charging the shim device D, D' according to the invention, the ratio of the two current intensities in the first circumferential current path L1 and in the second circumferential current path L2 is given solely by the inductances and the inductive coupling of the two circumferential current paths L1, L2 and is independent of the fixed spatial positioning of the charging coil P as long as the current change in the charging coil P in the third phase III is equal to the negative current change in the first phase I. The method according to the invention allows clearly defined field distributions to be generated using a single shim conductor track C.

In contrast to generating such current trajectories using two independent shim conductor tracks C, each having one opening, the current ratio between the two current paths L1, L2 and consequently the generated field distribution can be precisely controlled using the method according to the invention, since there is no dependence on the relative position of the charging coil P (or on the inductive couplings between the circumferential current paths L1, L2 and the charging coil P) or on the precision of the current changes in the charging coil P.

LIST OF REFERENCE SIGNS

C shim conductor track
D, D', D" shim device
E charging device
K cryostat
L1 first circumferential current path
L2 second circumferential current path
L3 third circumferential current path
M magnet coil system
MM main magnet
N normal plane
O1 first opening
O2 second opening
P charging coil
S1 first conductor track portion
S2 further conductor track portion
Sw1 first shim switch in the first conductor track portion
Sw2 further shim switch in the further conductor track portion
z axis
I first phase
II second phase
III third phase
$I_1$ current in the first circumferential current path
$I_2$ current in the second circumferential current path

LIST OF CITATIONS

[1] U.S. Pat. No. 8,965,468 B2 (Iwasa)
[2] DE 10 2016 225 017 A1 (Bruker BioSpin AG)
[3] DE 10 2018 221 322.4 (not published)

What is claimed is:

1. Shim device for a magnet assembly, the shim device comprising:
   at least one high-temperature superconductor (HTS) shim conductor track (C) and a first shim switch (Sw1),
   wherein the shim conductor track (C) lies on a surface that is curved around an axis (z), and the first shim switch (Sw1) is arranged in a first conductor track portion (S1) of the shim conductor track (C) and is arranged to interrupt a superconducting state of the first conductor track portion (S1),
      wherein the shim conductor track (C) extends around a first opening (O1) and extends around a second opening (O2) such that the shim conductor track (C) forms a first circumferential current path (L1), a second circumferential current path (L2) and a third circumferential current path (L3), wherein two of the three circumferential current paths (L1, L2, L3) each surround only one of the two openings (O1, O2) and one of the three circumferential current paths (L1, L2, L3) surrounds both of the two openings (O1, O2), and
      wherein the first conductor track portion (S1) in which the first shim switch (Sw1) is located is part of the first circumferential current path (L1) and is part of the second circumferential current path (L2) but is not part of the third circumferential current path.

2. Shim device according to claim 1, wherein the shim conductor track (C) is coiled in at least one layer around the axis (z) and has at least two conductor track portions that extend in parallel with the axis (z) and lie radially one above another.

3. Shim device according to claim 1, wherein the shim conductor track (C) extends symmetrically with respect to a reflection on a normal plane (N) of the axis (z).

4. Shim device according to claim 3, wherein the first circumferential current path (L1) and the second circumferential current path (L2) each extend antisymmetrically with respect to a reflection on the normal plane (N) of the axis (z).

5. Shim device according to claim 3, wherein the first circumferential current path (L1) and the second circumferential current path (L2) do not each extend antisymmetrically with respect to the reflection on the normal plane (N) of the axis (z).

6. Shim device according to claim 1, wherein the first circumferential current path (L1) has an inductance equal to an inductance of the second circumferential current path (L2).

7. Shim device according to claim 1, wherein the shim conductor track (C) is made of an HTS-coated film.

8. Shim device according to claim 7, wherein the HTS-coated film is electrically bridged with high resistance.

9. Shim device according to claim 1, further comprising a further shim switch (Sw2) arranged in a further conductor track portion (S2) and arranged to interrupt the superconducting state, wherein the further conductor track portion (S2) is part of the third circumferential current path (L3).

10. Magnet assembly for a magnetic resonance apparatus, the magnet assembly comprising:
   a cryostat having a room temperature bore,
   a superconducting magnet coil system arranged in the cryostat and having
      a main magnet configured to generate a magnetic field in a direction of an axis (z) in a working volume through which the axis (z) extends and
      a shim device according to claim 1 for setting a spatial profile and/or for spatially homogenizing a magnetic field generated by the main magnet in the working volume, and
   a charging device comprising at least one charging coil which is configured to inductively couple to the at least one shim conductor track (C) of the shim device.

11. Magnet assembly according to claim 10, wherein, during a charging process, the charging coil couples inductively, to varying degrees, to the first circumferential current path (L1) and to the second circumferential current path (L2).

12. Magnet assembly according to claim 10, wherein the three circumferential current paths (L1, L2, L3) inductively couple to the one charging coil.

13. Method for charging a shim device in a magnet assembly which comprises:
   a cryostat having a room temperature bore,
   a superconducting magnet coil system arranged in the cryostat and having
      a main magnet configured to generate a magnetic field in a direction of an axis (z) in a working volume through which the axis (z) extends and
      a shim device according to claim 1 for setting a spatial profile and/or for spatially homogenizing a magnetic field generated by the main magnet in the working volume, and
   a charging device comprising at least one charging coil which is configured to inductively couple to the at least one shim conductor track (C) of the shim device, wherein a change in electric current in the shim conductor track (C) is produced inductively through a change in a magnetic flux, generated by the charging coil, through the surface on which the shim conductor track (C) lies, said method comprising:

I. in a first phase (I), in any sequence, opening the first shim switch (Sw1) at least temporarily in order to interrupt the superconducting state, and inducing an electric current change in at least one of the circumferential current paths (L1, L2, L3) by changing a current in the charging coil or by moving the charging coil, II. in a second phase (II), closing the first circumferential current path (L1) and the second circumferential current path (L2) superconductingly by closing the first shim switch (Sw1); and III. in a third phase (III), when the first shim switch (Sw1) is closed, inducing electric current changes in the circumferential current paths (L1, L2, L3) by changing a current in the charging coil or by moving the charging coil.

14. Method according to claim 13, wherein the third circumferential current path (L3) remains superconductingly closed during the charging.

15. Method for charging a shim device in a magnet assembly, according to claim 13, wherein the shim device further comprises a further shim switch (Sw2) arranged in a further conductor track portion (S2) and arranged to interrupt the superconducting state, wherein the further conductor track portion (S2) is part of the third circumferential current path (L3), and wherein, in the first phase (I), before changing the current in the charging coil or before moving the charging coil, said method further comprises, in this order:

opening the further shim switch (Sw2) at least once in order to interrupt the superconducting state;

inducing further electric current changes in the circumferential current paths (L1, L2, L3) by changing a current in the charging coil or by moving the charging coil; and closing the further shim switch (Sw2).

\* \* \* \* \*